United States Patent [19]

Riecke

[11] 4,438,336

[45] Mar. 20, 1984

[54] CORPUSCULAR RADIATION DEVICE FOR PRODUCING AN IRRADIATION PATTERN ON A WORKPIECE

[75] Inventor: Wolfgang D. Riecke, Baden-Baden, Fed. Rep. of Germany

[73] Assignee: Fraunhofer-Gesellschaft zur Förderung der angewandten Forschung e.V., Munich, Fed. Rep. of Germany

[21] Appl. No.: 362,339

[22] Filed: Mar. 26, 1982

[51] Int. Cl.³ .................... H01J 37/147; H01J 37/26; H01J 37/30

[52] U.S. Cl. .................... 250/398; 250/311; 250/492.2; 250/491.1

[58] Field of Search ............... 250/398, 491.1, 492.2, 250/311; 219/121 EW, 121 EY, 121 EX

[56] References Cited

U.S. PATENT DOCUMENTS

| | | | |
|---|---|---|---|
| 2,356,633 | 8/1944 | Von Ardenne | 250/311 |
| 3,100,260 | 8/1963 | Wilska | 250/311 X |
| 4,338,508 | 7/1982 | Jones et al. | 250/492.2 X |

OTHER PUBLICATIONS

Hawkes, *Electron Optics and Electron Microscopy*, 1972, pp. 190-191.

*Primary Examiner*—Alfred E. Smith
*Assistant Examiner*—Jack I. Berman
*Attorney, Agent, or Firm*—John C. Smith, Jr.

[57] ABSTRACT

A corpuscular radiation device for producing an irradiation pattern on a workpiece by means of a beam emitted from a first radiation source and a first corpuscular-optical lens system suited for forming said beam is provided. The corpuscular-optical lens system includes means for adjusting the workpiece having opposed major surfaces, an at least partially beam-transparent reference object and a free beam passage opening. At the side of the workpiece remote from the first radiation source there is provided a second corpuscular-optical lens system including a beam switch, a second radiation source, an image receiver with a receiver surface, and a detector.

18 Claims, 5 Drawing Figures

CORPUSCULAR RADIATION DEVICE FOR PRODUCING AN IRRADIATION PATTERN ON A WORKPIECE

BACKGROUND OF THE INVENTION

This invention relates to a corpuscular radiation device for producing an irradiation pattern on a workpiece by means of a beam produced by a first corpuscular radiation source, including a system for precisely recognizing the position of the workpiece as well as possibly for the adjustment thereof, both by means of irradiating the bottom major surface of the workpiece and of adjustment marks possibly applied there, by a beam produced by a second corpuscular radiation source, as well as means for determining the mutual positions of both beams relative to one another, for determining the position of the first beam relative to the workpiece and for recognizing and operatively monitoring the configuration of said beam originating from the first radiation source and producing the irradiation pattern.

Such a corpuscular radiation device is preferably suited for producing irradiation patterns on semiconductor wafers in the production of integrated circuits. In this context, it is known from numerous publications to print the pattern on the workpiece by a focussed electron beam which scans the regions to be irradiated.

Such methods have been discussed for instance in a paper by T. H. P. Chang, M. Hatzakis, A. D. Wilson, A. J. Speth, A. Kern: "Grundlagen and Technik der Elektronenstrahl-Lithographie"—Fundamentals and Engineering of electron beam lithography—(Elektronik 26 (1977) No. 8, pages 51–60). Furthermore, other methods are known wherein the irradiation pattern is produced across large areas by means of transradiation of accordingly shaped masks. In one of these methods which has been disclosed in the German Pat. No. 25 15 549 a mask electron-beam transparent in its free areas is reproduced on a reduced scale by means of electron-optical lenses. In another such method which has been reported on at the 42nd Physicists Conference 1978 in Berlin (Conference Magazine page 1210, lecture D 12.4) by H. Bohlen, J. Greschner, W. Kulcke and P. Nehmiz under the title "Elektronenstrahl-Lithographie mittels Schattenwurf einer Maske in Chip-Grösse"—Electron Beam Lithography by means of Shadow Projection of a Mask in Chip Size—a mask provided close to the workpiece surface and transparent to electrons in parts of its area according to the required pattern is projected by means of parallel electron irradiation as a shadow image upon the workpiece surface in a manner almost corresponding to a photographic contact copy process. Finally, a photo cathode has also been formed as a mask as presented for instance in the U.S. Pat. No. 3,895,234, and the electrons emitted upon light irradiation in the desired area distribution are guided on the workpiece surface by means of a homogenous magnetic field.

In a similar manner, exposure patterns may be plotted on the workpiece also with ion beams. So for instance G. Stengl has reported on an "Ion-Projection System for IC Production" at the 15th Symposium on Electron, Ion and Photon Beam Technology in Boston, Ma., U.S.A., 5-29 to 6-1-1979 (lecture G-1), and at the same Symposium, D. B. Rensch, R. L. Seliger and G. Csanky have reported on scanning ion beam methods unter the title "Ion-Beam Lithography for IC Fabrication with Submicrometer Features" (lecture G-5).

Frequently, a plurality of irradiation patterns must be produced on the workpiece one after the other. This is even the rule for the production of integrated semiconductor circuits, the workpiece being removed after effected exposure of a pattern from the corpuscular radiation device and being treated further in the required manner. Such well-known further treatment processes are for instance etching, vapor deposition and oxidizing of the workpiece surface or implanting ions and finally also the application of a layer sensitive to corpuscular radiation exposure which may be developed after a renewed exposition of a pattern selectively on irradiated or on non-irradiated surface regions by a chemical solution.

When plotting a further pattern on a semiconductor workpiece, the essential matter now is that the pattern assumes an accurately defined position in all its details in relationship to the structures already present on the workpiece, these having been produced for instance by means of one or more preceding exposures. There is the difficulty that the patterns to be exposed with the corpuscular beam predominantly consist of structures having very fine details within which the characteristic detail dimensions are around 1 $\mu$m or even below and that therefore such fine structures are able to be superimposed satisfactorily in consecutive processing steps and brought into a correct functional interdependency only if their mutual position deviation remains small in relationship to the minimum dimensions of the structure details. This means, however, that the permissible mutual position insecurity between the finest structures of different processing operations may at the most be small fractions of a $\mu$m.

Now the electron beam, however, is able to be deflected reasonably error-free along a distance of several mms only and since on the other hand in technology of producing integrated circuits the typical workpiece is a silicon wafer of a diameter of several cms, a mechanical transverse shifting of the silicon wafer must be coupled with a magnetic or electric deflection of the corpuscular beam if a pattern is to be exposed across the entire surface of the workpiece at disposal. For doing so, it is conventional to control the precision of the mechanical shifting motion of the table on which the workpiece is placed by means of a laser interferometer, as for instance described in a paper by H. de Lang and G. Bouwhuis: "Genaue digitale Messung von Verschiebungen mit optischen Mitteln II. Die Messung von Verschiebungen mit einem Laser-Interferometer"—Precise digital measurement of small mechanical translations employing optical means II. The measurement of small mechanical translations employing a Laser interferometer—(Philips techn. Rdsch. 30 (1969/70) No. 6/7, pages 165-170). With a laser interferometer, the position of the translation table may be monitored to about one quarter of the wavelength of the light used, i.e. to 0.1 to 0.2 $\mu$m. This, however, still in no way means that the position of the point of impingement of the corpuscular beam upon the workpiece is known with the same precision. Rather, it has to be expected that the workpiece does not return to exactly the same position on the translation table when it has been removed between two pattern exposures for performing other processing steps from the corpuscular radiation device. Also, a shape variation of the workpiece may arise, for instance by distortion of the semiconductor wafer in the thermal processing steps in the course of producing highly integrated circuits.

In addition thereto, the point of impingement of the corpuscular beam may also be shifted in the workpiece plane in that the corpuscular-optical system of the irradiation device distorts in the event of minor fluctuations of temperature or by an internal temperature compensation or that a mechanical creeping occurs. Similar beam shifts may in addition thereto be caused by slow variations of the chargings at the internal wall of the corpuscular radiation device and the concurrent variation of beam repulsing, such variations of charging up often occurring with corresponding variations of the beam current.

Thus, a fine adjustment of the corpuscular beam is required in relationship to the workpiece surface. It is normal to direct the corpuscular beam to adjustment marks which have previously been applied to the surface of the workpiece. The adjustment marks and the environment thereof are then scanned in the form of line scans, and from the variation of the current of backscattered corpuscles or secondary emission electrons, the position of the edges of the adjustment marks is determined. Such adjustment marks are frequently arranged in such positions and in just so large a mutual spacing that they mark the corners of such a partial field of the surface with the workpiece stationary and thus solely by beam deflection can be scanned without any appreciable deflection error by the exposure pattern producing corpuscular beam. In numerous publications, there have been reports in literature on the shape and on the optimization of such adjustment marks at considering diverse aspects.

With these marks, a main disadvantage is that a part of the surface of the semiconductor wafer cannot be used for integrated circuits, namely that part of the surface which is covered by the adjustment marks themselves and the direct environment thereof which are scanned by the corpuscular beam when monitoring the position of the adjustment marks.

Other disadvantages result from a deterioration of the resolving power effective for localizing the mark positions: Obviously, during application of the lacquer coating, the adjustment marks are covered by the irradiation-sensitive lacquer coating as well as the far larger useful area actually to be described with the details of the integrated circuit. When the position of the adjustment marks is scanned with the corpuscular beam, the incident corpuscles must initially penetrate the lacquer coating before striking the adjustment marks for producing backscattered corpuscles and secondary emission electrons. When passing through the lacquer, the corpuscles are scattered, and there is an appreciable loss of resolving power in comparison to the accuracy attained in determining the position of adjustment marks not covered by lacquer.

Finally, in the known methods the location of the position of the adjustment marks requires time which is lost for the actual scanning processing of the workpiece, and a continuous control and monitoring of the workpiece position is principly not possible in real time.

In efforts to plot finer and finer structures with dimensions of clearly below 1 μm the last mentioned restrictions become increasingly notable in particular.

SUMMARY OF THE INVENTION

It is an object of the present invention to overcome these restrictions and to provide a corpuscular radiation device for producing an irradiation pattern on a workpiece which enables a substantially more precise determination and better monitoring of the positioning of the corpuscular beam upon the surface regions of the workpiece to be irradiated.

Beyond the precise positioning of the point of impingement of the corpuscular beam, the device according to the invention is also used to render directly visible the shape and dimension of the beam cross section striking the workpiece surface and to effect a control of its defects. For instance, for beam cross sections which are required to be circular or elliptical from the start on, an elliptical deformation can be immediately noted which may be caused by an axial astigmatism of the corpuscular-optical lenses. This astigmatism is able to be corrected under control by direct observation employing a stigmator.

The observation of the beam cross section in the processing plane is particularly useful by means of the system according to the invention when the processing beam cross section is not simply of a circular disc shape, but is of a more complicated shape, a simultaneous exposition of larger circuitry regions and a much quicker plotting of the irradiation pattern thereby being possible. Such methods have for instance been described in the paper by H. C. Pfeiffer and G. O. Langner, "Advanced beam shaping techniques for electron lithography" in the Proceedings of the "Symposium on Electron and Ion Beam Science and Technology", 8th Int. Conf., Seattle 1978, pages 149-159. In this method designated "character projection", the electron beam cross section on the workpiece surface may not only be shaped as a square or a more or less elongated rectangle, but for instance also as a configuration of the letters L, T or V. By directly observing the beam cross section in the workpiece plane, with the system according to the invention then disturbance in the configuration of the beam cross section may be immediately recognized, as may result for instance by damaging or contamination of the shaping mask or by charging.

BRIEF DESCRIPTION OF THE DRAWINGS

Embodiments of the invention will now be described by way of example and with reference to the accompanying drawings in which.

DESCRIPTION OF THE PREFERRED EMBODIMENTS

Figure 1:
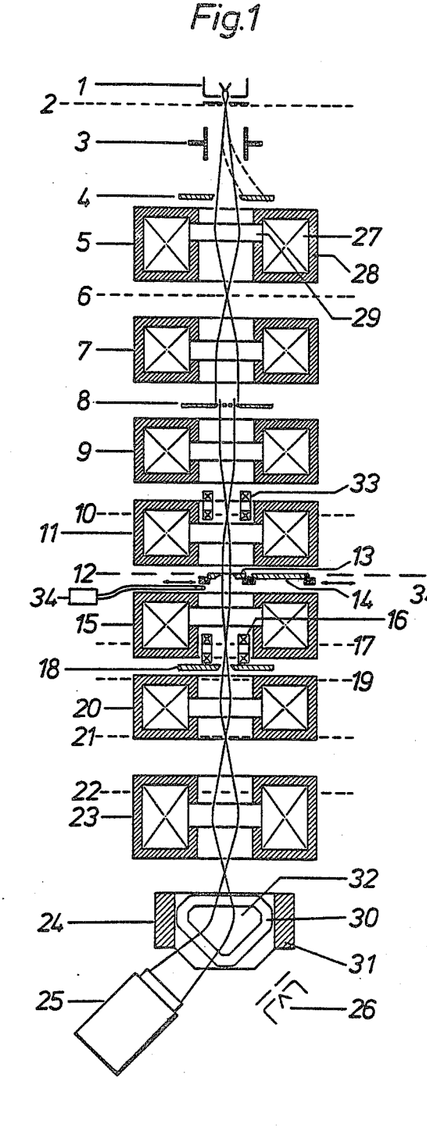
FIGS. 1 and 2 are diagrams representing two embodiments of the device for corpuscular radiation exposure built up according to the invention.
Figure 2:
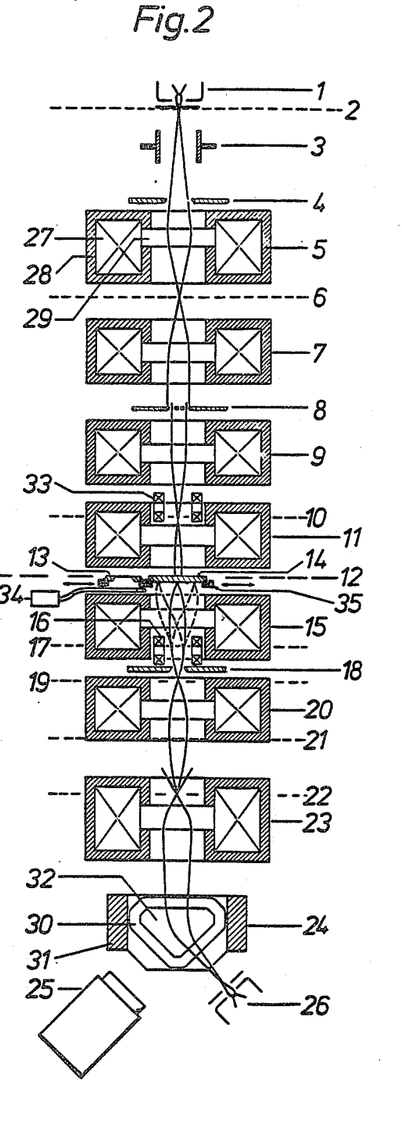

The construction of a corpuscular radiation device according to the invention with which the mentioned tasks may be performed is illustrated in FIGS. 1 and 2. As an example, in the illustrated case, electron beams are used as corpuscular beams. Two beam paths have likewise been shown which are typical for this corpuscular radiation device according to the invention. A thin disc of semiconductor material (a "wafer") having opposed major surfaces is assumed to be the workpiece 14, as conventionally used for the production of highly integrated circuits. At its major surface 12 facing a first radiation source 1, an irradiation pattern is to be applied.

The plane containing the major surface 12 of the workpiece 14 subdivides the entire corpuscular-optical system into two partial systems which depending on the intended purpose are able to be operated with a single common corpuscular beam or separated from one another and independently with an own corpuscular beam.

With each partial system having its own corpuscular beam it represents a corpuscular beam lithography device known per se the corpuscular beam of which is produced by the first radiation source 1. For the purpose of the present invention, it is in this context not important which specific type of a lithography device is used. In a paper by T. H. P. Chang, M. Hatzakis, A. D. Wilson and A. N. Broers: "Electron-beam Lithography draws a finer line" (Electronics 50 (1977) No. 10, May 12, pages 89–98) in FIG. 4 (page 93) three different scanning electron-optical systems are illustrated which produce fine electron beams with different current density distributions: a rotationally symmetrical current distribution with a current gradient in the manner of a Gauss distribution, a disc-shaped beam cross section with homogenous current density and a square beam cross section likewise with a homogenous current density. Each of these three scanning electron-beam lithography systems could be used in an electron-beam device according to the invention as the corpuscular-optical partial system associated with the first radiation source 1. The advantages of the electron-beam device according to the present invention will become evident specifically, however, when an electron-beam microprojection system is used as the partial system associated with the first radiation source 1, as described for instance by M. B. Heritage in the paper "Electron-projection microfabrication system" (Jour. Vac. Sci. Technol. 12 (1978) No. 5/6, pages 1135–1140), wherein complete partial regions of the irradiation pattern are able to be exposed simultaneously with a plurality of structure details. Here, the invention at any time permits the control for the proper shape of the electron beam to correspond to the required configuration down to every minor detail.

The corpuscular-optical lens system known per se, of such an electron-beam microprojector is illustrated in FIGS. 1 and 2 as an example for a corpuscular-optical partial system associated with the first radiation source 1, in the arrangement of the invention. In detail, the reference numeral 8 designates a mask permeable in partial regions to the electron beam, said mask 8 being reproduced at a reduced scale on the major surface 12 of the workpiece 14 by a telecentric lens system 9, 11.

The electron beam required for this is produced by the first radiation source 1 which has been illustrated as an example in the form of a conventional triode system, comprising a hairpin glow cathode, a Wehnelt grid and an anode in the usual simplified way of illustration. Other electron guns may also be used without impairing the invention purpose as the first radiation source 1, for instance electron guns with lanthan hexaboride cathodes, as described by R. Shimizu, T. Shinike and S. Ichimura in the paper "Highly stable single-crystal $LaB_6$ cathode for conventional electron microprobe instruments" (Jour. Vac. Sci. Technol. 15 (1978), No. 3 pages 922–926).

The electron beam is expanded by demagnification of the narrowest beam cross section 2 (the cross-over) by means of a short-focus first condenser lens 5, rendered parallel by a long focal-length second condenser lens 7 and irradiates the mask 8. The reduced-scale image of the radiation source produced by the condenser lens 5 arises in the front focal plane 6 of the condenser lens 7 and is transferred thereby in joint optical action with condenser lens 9 into the rear focal plane 10 of said latter lens 9. Said rear focal plane 10 corresponds to the front focal plane of the object lens 11. Thus, a parallel irradiation of the workpiece 14 is provided for which is known to be preferred so that a wavyness in the ideally precisely planar workpiece surface does not result in a distortion of the pattern.

A magnetic deflection system 33 indicated in the rear focal plane 10 of the condenser lens 9 is provided for a fine adjustment of the position of the irradiation pattern in view of the structures which are already present on the workpiece 14.

An electrostatic deflection system 3 serves to switch off the beam which is caught by an aperture 4 in the condition deflected as indicated by interrupted lines.

Regarding the illustration in FIGS. 1 and 2, it is further added that the corpuscular-optical elements have been represented in the usual simplified manner. The magnetic deflection system 33 positioned in the rear focal plane 10 of the condenser lens 9, represented by two field coils producing a magnetic field parallel to the drawing plane and causing the deflection normal of same, must be assumed to be supplemented by a second deflection system rotated by 90° relative to the first one, the field coils of which are positioned in front of and behind the drawing plane and provide for the deflection parallel to the drawing plane. The corpuscular-optical lenses are assumed to be electromagnetic lenses in FIGS. 1 and 2 and are, as illustrated by referring to the first condenser lens 5, illustrated coarsely simplified to a lens coil 27 and an iron shroud 28 encapsulating same, said shroud 28 in turn being interrupted by a lens gap 29.

It should be noted in this context that the use of electromagnetic lenses and deflection systems is not mandatory for the purpose of this invention. Permanent magnetic or electrostatic corpuscular lenses represent components of prior art just as well usable instead of electromagnetic lenses as electric deflection systems.

The above discussed corpuscular-optical arrangement associated with the first radiation source 1 is prior art and is suited for producing an irradiation pattern on a workpiece. This arrangement known per se is now advanced by corpuscular-optical elements and further components into a novel corpuscular-optical device which is the subject matter of the invention.

The complete device according to the invention therefore is substantially composed on the one hand of the above discussed first partial system illustrated in FIGS. 1 and 2 above the plane containing the major surface 12 of the workpiece 14 and on the other hand of a second partial system which is represented in FIGS. 1 and 2 underneath the said plane. A characteristic of this second partial system is that it is provided at its lower end with a magnetic beam switch 24 and is selectively operable with two radiation directions opposed to each other.

In electron optics, a beam switch is understood to be a special deflection element consisting of a constant magnetic field, wherein two different electron beams are deflected in such a way that the direction of emergence of the first beam and the direction of incidence of the other beam coincide. When identical deflection angles are used for both beams, an automatic result is that the path of the two coinciding beams coincides with one of the extended angle bisectors between the two individually travelling beams and is normal to the other angle bisector. Two non-coinciding beam directions thus also determine the third one. Such a symmetry of the beam paths wherein the coinciding beams travel on the extended angle bisector of the individually traveling beams occurs for instance when both beams are electron beams having the same velocity. When the two beams are of different velocities, this symmetry is not provided, but the effect of the magnetic field as beam switch is maintained, provided the deflection angles are only made large enough.

It is clearly perceivable that the beam switch differs in a characteristic manner from the conventional beam deflection systems, deflection systems which are characterized in that their magnetic fields are able to be continuously varied and reversed in direction: In these beam deflection systems, the incident beam is fixed, and the direction of the emitted beam is selected by adjusting the deflection field.

The above-mentioned two beams deflected in the beam switch may fundamentally be beams which have been produced in two different radiation sources. On the other hand, both beams may also originate from one and the same radiation source. The two beams running in opposite sense on a common path may for instance then be produced in that the emerging beam is reflected orthogonally at an electron mirror and thus becomes an incident beam again. An arrangement of this kind is used in electron mirror microscopes. Such a microscope has for instance been illustrated in FIG. 4.20 on page 190 of the book "Electron Optics and Electron Microscopy" by P. W. Hawkes (Taylor & Francis Ltd., London, 1972).

A magnetic beam switch in conjunction with an electron mirror has been employed in several instances already in electron optics. The beam switch has for instance been used, as mentioned, in an electron mirror microscope in order to separate the illuminating beam path from the imaging beam path, a detailed report being provided on this by L. Mayer in the paper "Electron Mirror Microscopy" in the Encyclopedia of Microscopy (Editor G. L. Clark, 1960, pages 316-325). In a further application, the property is utilized that for a fixed magnetic field strength in the beam switch the corpuscular beam paths differ when the velocity of the corpuscles has corresponding differences. This effect may be utilized in conjunction with the electron mirror for constructing a velocity filter as has for instance been described by R. Castaing in the paper "Quelques applications du filtrage magnetique des vitesses en microscopie électronique" (J. appl. Physics 27, 1969, v. 3, pages 171-178). This beam path has finally been advanced by the addition of electrostatic biprisms by H. Lichte into an "Elektronen-Auflichtmikroskop zur Präzisionsmessung von Unebenheiten und Potentialunterschieden auf Oberflächen" (PTB-Mitt. 89, (1979), v. 4, pages 229-236). The use of a beam switch in conjunction with two electron beams which originate from two different radiation sources has not been disclosed up to now. It is used in this manner for the instant invention for the first time.

The principle of operation of the lower partial system illustrated in FIG. 1 corresponds to the principle of operation of an electron microscope wherein the beam is to be imagined to extend in FIG. 1 from the top to the bottom. In FIG. 2, the second partial system operates as scanning electron microscope the beam of which produced by a second radiation source 26 is directed from the bottom to the top of FIG. 2.

The use of the beam switch according to the invention is perceivably a different one than in the apparatus explained hereinbefore and characterizing prior art. So in the latter the beam switch is always used in conjunction with an electron mirror which is not at all present in the arrangement according to the invention. Furthermore, the beams of the separated beam paths according to the invention originate from two different radiation sources 1 and 26, while in the arrangements of prior art one and the same beam passes through the beam switch twice, once before and once after reflection at the electron mirror.

The two beam paths which according to the invention are selectively used in the second corpuscular-optical partial system underneath the plane containing the major surface 12 of the workpiece 14 in FIGS. 1 and 2 are separated from one another at the end of the device disposed at the bottom in the drawing by the magnetic beam switch 24 known per se. This beam switch 24 essentially comprises a homogeneous magnetic field extended over a larger space region and must be considered normal to the drawing plane in FIGS. 1 and 2. The magnetic field extends in the strongly simplified representation used here between planar pole shoes 32 which are to be imagined to be disposed in pairs in front of and behind the drawing plane, and it is produced by field coils 30 surrounding the pole shoes. The external stray field is received by a ferromagnetic short-circuit yoke 31. It is emphasized that the illustration of the beam switch 24 is to be considered to be diagrammatic in FIGS. 1 and 2 in the sense that other configurations may also suit the purposes of this invention just as well, for the only thing relevant for the beam switch is the production of a homogenous magnetic field orthogonal to the beam which field extends throughout a sufficiently extended space region. Because of the substantially opposite beam directions in FIGS. 1 and 2, accordingly the opposite Lorentz forces and beam deflections result which are required for the beam switch. In contradistinction to the other corpuscular-optical elements of the arrangement according to the invention, the realization of the beam switch is not possible in an electrostatic manner. In the arrangement according to the invention as illustrated in FIGS. 1 and 2, an image receiver 25 having a receiver surface is associated with the electron microscopic beam path extending from the top to the bottom in FIG. 1, the second radiation source 26 being associated with the scanning electron microscopic beam path extending from the bottom to the top in FIG. 2. The image receiver 25 and the second radiation source 26 substantially are arranged at the same distance from a lens 23, and they are generally arranged juxtaposed. The beam switch 24 now ensures that on the one hand the conical imaging beam of the microscopically enlarged beam path according to FIG. 1 is directed to the electron-beam sensitive receiver surface of the image receiver 25 and on the other hand in the scanning electron microscope case the beam produced by the radiation source 26 is threaded onto the axis of the lens 23.

The lens 23 as well as two further lenses 15 and 20 are used both in the scanning electron microscopic beam path of FIG. 1 and in the scanning electron microscopic beam path of FIG. 2. Referring to the electron-microscopic principle of operation of FIG. 1, the lens 15 would in usual terminology be called the objective lens, the lens 20 the intermediate lens and the lens 23 the projector lens. An aperture 18 is associated with the object lens 15. As far as the corpuscular-optical beam path is concerned, the plane which coincides with the major surface 12 of the workpiece 14 to be irradiated is enlarged by the objective lens 15 into the object plane 19 of the intermediate lens 20, further enlarged thereby and transferred into the object plane 22 of the projector lens 23 and projected, further enlarged, by the latter onto the receiver surface of the image receiver 25.

According to the invention, an opening is provided in a traversal stage 35 only indicated in FIGS. 1 and 2 and carrying the workpiece 14, through which opening the electron beam is able to pass unobstructed after the required alignment of the table. When the specimen stage 35 has been properly adjusted, the beam density distribution present in the plane containing the major surface 12 of the workpiece 14 is enlarged by the electron-microscopic imaging beam path as per FIG. 1 and displayed on the receiver surface of the image receiver 25.

This is the principle of operation by means of which the configuration and size of the corpuscular beam incident on the workpiece surface are able to be checked and monitored.

In the scanning electron microscopic mode of operation illustrated in FIG. 2, the lenses 23 and 20 would now have to be called condensers, the lens 15 an object lens. The aperture 18 is associated with the object lens 15 and is disposed shortly in front of the front focal plane 17 thereof. A deflection system 16 used for scanning is likewise disposed in the region of the focal plane 17 and is preferably arranged, as viewed in axial direction, in such a way that the beam deflection actually performed in a continuous manner corresponds to a sharp beam tilting in the front focal plane 17. In this preferred arrangement of the deflection system 16, the beams deflected in the scanning mode always stay axis-parallel and strike the bottom side of the workpiece 14 normal thereto. The risk is then avoided that irregularities on the bottom side of the workpiece may result in a distortion of the image of the scanned region. This is of significance for the instant invention particularly because the position or a transverse movement of the workpiece is to be determined by means of generating a scanning microscopic image of the bottom side of the workpiece and detecting marks provided there. If a for instance thermally caused distortion of the semiconductor wafer in the form of a waviness of the bottom surface has resulted in the workpiece due to preceding processing steps, this would simulate for an inclined beam incidence a lateral offset of larger parts of the workpiece surface in correspondence to the waviness.

According to the invention, the imaging system of the scanning electron microscope according to FIG. 2 is provided for three duties: firstly for determining the position and/or the shifting of the workpiece in relationship to the lens system 15, 20, 23; secondly for determining the position of the beam associated with the first radiation source 1 and provided for pattern exposure in relationship to the lens system 15, 20, 23, this determination naturally being performed in conjunction with the electron-microscopic beam path according to FIG. 1 and occurring at using an at least partially transradiatable reference object 13; thirdly for determining the position of the point of intersection of the bottom side of the workpiece 14 with the axis of the object lens 15.

The scanning of the bottom side of this semiconductor wafer to be irradiated in an electron-beam lithography device is per se not novel and has been described for instance in a presentation under the title "CUMMS II, An Electron Beam Fabrication Machine with Accurate Registration for Direct Fabrication and Maskmaking", by G. H. Jones and H. Ahmed at the "15th Symposium on Electron, Ion and Photon Beam Technology", Boston, May 29 to June 1, 1979 (Lecture F 1). Another such apparatus has been described in the German published patent application No. 2555636.

The mentioned devices are based on the problem that, after the workpiece wafer has been removed from the corpuscular beam apparatus after a first irradiation and has been subjected to a further processing, and after the workpiece wafer has then been placed back into the corpuscular beam radiation apparatus, the position of the workpiece wafer is recognized by scanning the bottom side of the workpiece and characteristic details present there or specific marks applied there during earlier processing steps.

It is important to realize that the determination of the position of the workpiece effected by scanning the bottom side of the workpiece, in relationship to the corpuscular radiation apparatus, generally does in no way have to mean that the corpuscular beam used for applying the pattern has the position desired in regard to the workpiece. For this is perceivably only the case in this method when it can be taken for granted that both the corpuscular beam scanning the bottom side of the workpiece and the beam plotting the pattern underneath the corpuscular radiation device are able to be adjusted into the desired positions precisely and reproducibly by means of the deflection systems. In practice, however, it will have to be expected that for both corpuscular beams over extended periods of time slow position variations occur in relatonship to the corpuscular radiation apparatus, which may for instance be caused by a gradual electric charging of the internal walls of the apparatus facing the corpuscular beams and/or by mechanical or thermal distortion of the corpuscular-optical systems forming the beam. This is a substantial weakness in practice, which will become the more perceivable the finer the structures to be exposed become, which may inhibit the operational use thereof because of the unreliabilities concurrent therewith and the risk of fabricational waste.

It is characteristic for the invention described herein that it principly eliminates this weakness in that the beam paths associated with the two radiation sources 1 and 26 in relationship to the position and possibly the amount and the direction of deflection are interlaced in the manner to be described hereinafter, in the plane which contains the surface 12 of the workpiece 14, or in a plane closely adjacent thereto in axis direction. Thereby, the precise course of the beam paths within the two corpuscular-optical partial systems separated by the said plane becomes of a second-rank significance.

In addition thereto, it is thereby achieved that it is not required to make the two corpuscular-optical partial systems illustrated above and below the plane of the surface 12 of the workpiece 14 in FIGS. 1 and 2 in regard to their mechanical configuration so extremely rigid both in themselves and relative to one another that in the plane of the surface 12 the position unreliability of the beams stays clearly lower than the required structure resolution of the pattern to be applied. This structural rigidity is hardly to be achieved in practice and would be necessary if one would blindly rely on the set values of the lenses' focal forces and deflection field intensities in order to precisely establish the position of the beam in the plane of the surface 12 of the workpiece 14.

The provision of an apparative possibility to extremely precisely interlace the two beams paths, however, just is the essence of the instant invention and represents a decisive new quality for the precise positioning of the pattern to be applied in relationship to the described art.

For performing the mutual position determinations of the two beams, according to the invention the reference object 13 is provided which is at least partially transradiatable and arranged in the plane of the surface 12 of the workpiece 14 or in the close proximity thereof. This reference object 13 is constructed according to the invention in such a way that it contains characteristic details which may be observed and detected in the corpuscular-microscopic imaging beam path according to FIG. 1 via the image receiver 25 and located in the scanning microscopic beam path according to FIG. 2.

Such reference objects may preferably consist of line-like structures which are for instance drawn with an electron-microscopic microrecorder which has been described in a paper by K.-H. Müller under the title "Elektronen-Mikroschreiber mit geschwindigkeitsgesteuerter Strahlführung", Part I: OPTIK 33 (1971), pages 296–311 and part II: OPTIK 33 (1971), pages 331–343. For the instant purpose, the only relevant aspect is that one or possibly several readily detectable reference points are marked on the reference object, the extent of these reference points being clearly much smaller than the permissible position unreliability permitted when registering the pattern. To this end, for instance a mark in the form of a group of concentric circles is suitable, on the drawing of which a report has likewise been given in the above quoted paper by K.-H. Müller, the central point common to all circles being the reference point. Another advantageous configuration of the reference points is derived via the shape of a cross, the point of intersection of the lines of the cross marking the position of the reference point. Such marks designed in cross shape are known to be suitable for the positioning of the beam controlled by a computer system in an electron-beam lithography system, as described by D. E. Davis, R. D. Moore, M. C. Williams and O. C. Woodard in a paper under the title "Automatic Registration in an Electron-Beam Lithographic System" (IBM Jour. Res. Develop. 21 (1977) No. 6, pp. 498–505).

It is clear from the start on that geometrically simple structures such as the circles and crosses just discussed as examples are particularly well suited for a fully automatic position detection controlled by computer systems. However, other reference objects more complicated may also be used, for instance sufficiently clearly structurized electron-microscopic specimens. However, it must be expected in such instances that the position recognition by means of the data processing system will call for higher technical expense than with the geometrically simple structures.

Figure 4:
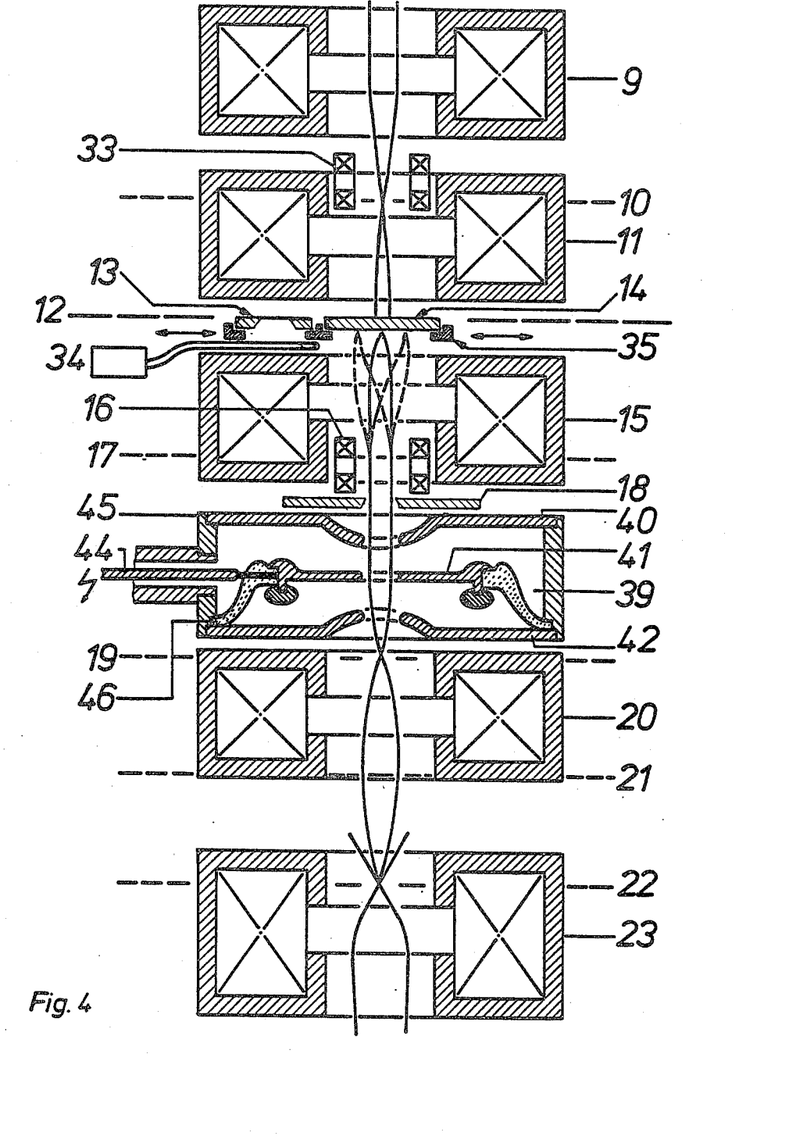
FIG. 4 shows schematically an embodiment of the device, where one of the lenses employed is an electrostatic, lens, and FIG. 5 schematically shows the beam path effective when the center electrode of the electrostatic lens is connected to ground potential.

The reference object 13 is preferably secured to the same traversal stage 35 which also carries the workpiece 14. By laterally displacing the stage 35, then either for a mutual registration of the two beams the reference object 13 may be brought into the beam path which is the situation of FIG. 1, or the workpiece 14 to be irradiated is shifted to the axis, as illustrated in FIG. 4, when the irradiation pattern is exposed.

According to the invention, as already mentioned hereinbefore, a free passage opening is provided in the traversal stage in beam direction which may likewise be brought into the beam by a suitable displacement of the traversal stage and which then ensures free passage for the beam emerging from the radiation source 1. This setting is used in the case when in the manner described hereinbefore the shape of the beam cross section used for the pattern exposure is to be observed via a corpuscular-optically enlarging image on the input plane of the image receiver 25. For this purpose, it also alternatively is possible to provide a sufficiently large free area within an extended reference object 13, said free area permitting an unobstructed beam passage.

Specific measures are required regarding the illumination of the reference object 13 when the corpuscular beam plotting the pattern is of a diameter which is materially smaller than that partial surface of the reference object 13 which must necessarily be reproduced upon a mutual alignment of the beam paths associated with the radiation sources 1 and 26, in order to recognize and locate the reference points. In this case, an effective expansion of illumination is achieved in that the required partial surface of the reference object 13 is covered with the corpuscular beam produced by the radiation source 1 in the form of a dense scan.

Such a measure is mandatory when the corpuscular-beam lithography system associated with the radiation source 1 operates with a traversing corpuscular beam which is passed either in a scanning pattern or with a more complicated deflection strategy across larger areas of the pattern to be exposed. In this regard, the deflection system present anyhow and affecting the generation of the exposure pattern may also be used for the expansion of illumination of the reference specimen effected by scanning.

The scan-like motion of the illumination for the reference object 13 may also be of an advantage in the event a projection method is utilized for plotting the pattern, for instance a method with the beam path illustrated in FIG. 1. In this case, the illumination from the start on extends across a large area of the reference object 13, but is not uniform, rather in the way of the pattern to be plotted in a highly structured configuration. This renders difficult the recognition of the reference marks, which is of particular consequence when the adjusting method is performed fully automatic and is to be controlled by a data processing system. There it is advantageous to provide for a blurring of the pattern structures of the illuminating beam and thus for a uniform illumination by oscillatory deflection of the beam with the help of the deflection system 33 in a time mean.

When mutually aligning the beam paths associated with the two radiation sources 1 and 26, the beams may be switched on only alternatively, for with the scanning electron microscopic deflection system 16 in operation, the corpuscular-microscopic beam path according to FIG. 1 would by tilted by the deflection field in a raster-scan-like fashion and the image continuously displaced in time in a corresponding manner. In contradistinction thereto, in the exposure of the pattern illustrated in FIG. 2 by the corpuscular beam associated with the radiation source 1 at the same time also the scanning electron microscope associated with the second radiation source 26 can be operated without disturbances.

A particularly advantageous construction results when the object lens 11 and the object lens 15 together with their associated deflection systems 33 and 16 are arranged symmetrical relative to the plane of the major surface 12 of the workpiece 14 and when their lens coils have the same number of turns. When the two coils are arranged in series with opposite directional sense of the lens current, the entire image rotation of the telecentric doublet resulting in this way disappears, whereby, as known from theory, the anisotropic image errors also disappear. For image points further remote from the axis, the imaging error called image field curvature may be eliminated by a single current variation common to both coils and determined in its magnitude completely by the off-axis distance of the imaged point, whereby then for off-axis annular zones the two partial optical systems corresonding to the beam sources 1 and 26, respectively, have a common plane of best focus too, and this plane also coincides with the plane of the major surface 12 of the workpiece 14.

Figure 3:
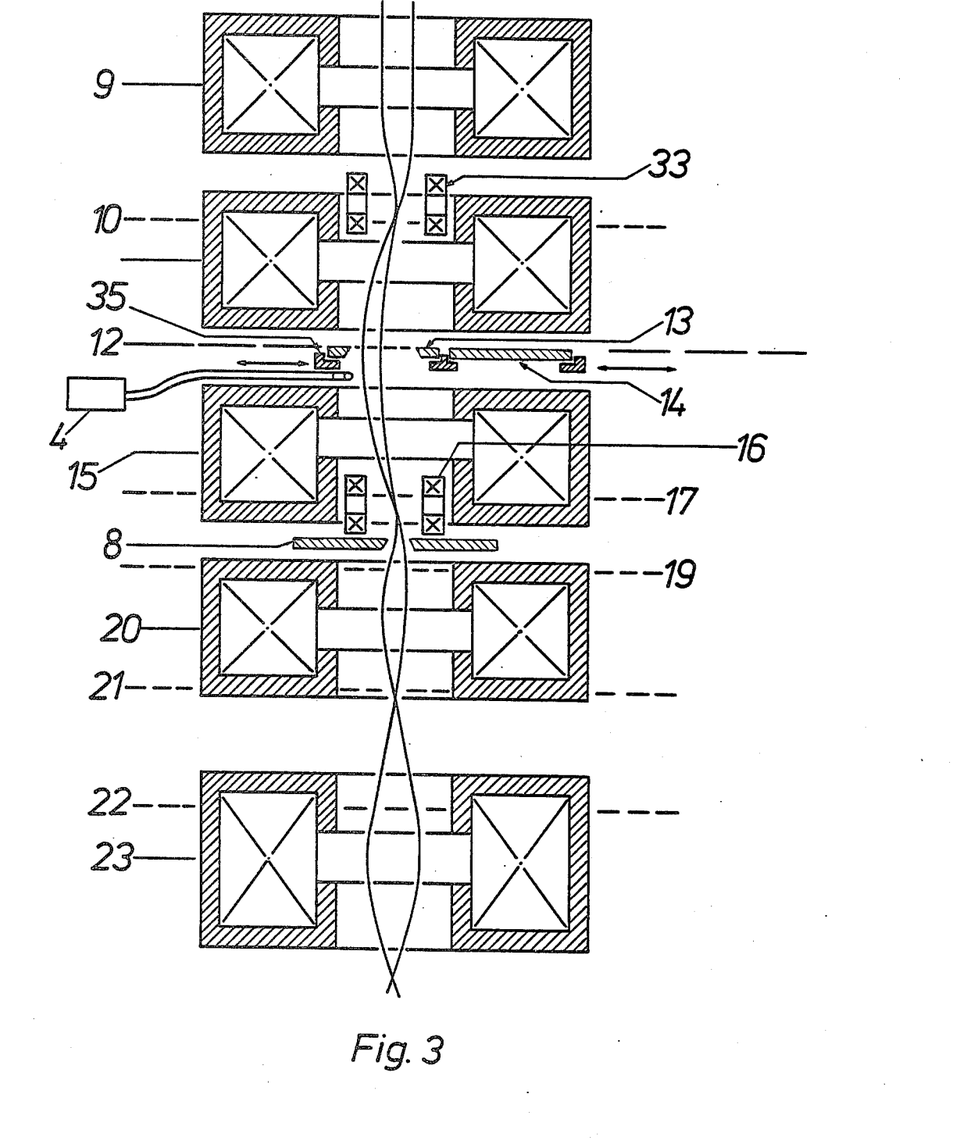
FIG. 3 is a diagram to a larger scale of part of the beam path of the corpuscular-optical exposure system.

These properties in conjunction with two deflection systems in specific positions, namely the deflection system 33 arranged in the front focal plane 10 of the object lens 11 and the deflection system 16 arranged in the rear focal plane of the object lens 15 gives way to a particularly favorable possibility of observing the beam position even for large deflection angles and large distances of the beam from the lens axis. By the position of the deflection systems in the focal planes, it is ensured that—independent of the distance between the axes—the corpuscular beams have beam axes parallel to the axis in the plane of the major surface 12 of the workpiece 14 and that they are aligned behind the deflection system again to and in direction of the axis of the intermediate lens 20. This beam path of the corpuscular-optical reproduction system according to the invention is illustrated in FIG. 3. The beam path in front of the lens 9 and behind the lens 23 is the sme as in FIG. 1 and thus need not be newly illustrated in FIG. 3.

Also for more off-axis beams and imaged fields it is necessary for the corpuscular-microscopic imaging of the reference object 13 that a somewhat larger partial surface of the reference object is uniformly irradiated, so that marks possibly provided there may be illuminated and recognized. To this end, conveniently a scan-like deflection is superimposed over a constant basic deflection of the deflection system 33 in precise analogy to the above-discussed method for the corpuscular-microscopic imaging of marks which are disposed near the axis of the corpuscular radiation device of this invention.

In contradistinction thereto, the deflection system 16 which is primarily provided for the scanning-microscopic imaging according to FIG. 2 and which then operates with scan-like varied deflection angles is now operated in the beam path according to FIG. 3 with a deflection variable with the basic deflection of system 33, but otherwise constant in time. When the deflection systems 33 and 16 are arranged symmetrical relative to the plane containing the major surface 12 of the workpiece 14 just like the lenses 15 and 20, the deflection by the deflection system 16 is just equal in magnitude to the basic deflection of the deflection system 33, but directed opposite in the deflection sense.

When a sufficiently extended reference object 13 is used having a plurality of marks the mutual spacings of which are known, the deflection angles belonging to certain beam displacements may be determined and operatively controlled with the principles of the operation as per FIGS. 1 and 3.

Another duty according to the invention of the scan-microscopic corpuscular radiation system is the determination of the axial position of the bottom side of the workpiece 14 and of the variation of this position upon transversely shifting the workpiece 14 using the trasversal stage 35. The focussing of the scanning microscope required therefor to the bottom side of the workpiece 14 is provided by varying the current J in the coil of the object lens 15. Methods suitable for this which are also suited for automatic focussing are prior art and have been described for instance by L. Reimer and G. Pfefferkorn in the book "Raster-Elektronen-Mikroskope" (Springer publishing house, 1973) on page 69. For instance, for a linewise scanning of the object the occurrence of the maximum in the short periodical space frequencies registered by a detector 34 may be a good criterion of accomplishing the precise focusing.

It is known from theory that an increase $\Delta J_{15}$ of the best focus current $J_{15}$ in the coil of the object lens 15 indicates a displacement of the bottom side of the workpiece 14 by $\Delta Z_{15} = 2 C_{C,15} \Delta J_{15}/J_{15}$ downwardly, $C_{C,15}$ meaning the coefficient of chromatic aberration of the lens 15. When the workpiece has the shape of a disc of uniform thickness throughout, then also the top side of the workpiece facing the first radiation source 1 is also displaced by the same amount $\Delta Z_{11} = -\Delta Z_{15}$.

The lack of focus of the pattern caused thereby may then, possibly likewise automatically, be compensated by a defocussing of the object lens 11 by means of a variation $\Delta J_{11}$ of the current $J_{11}$ in the coil of this lens. Therefor, the equation correlation $\Delta Z_{11} = 2 C_{C,11} \Delta J_{11}/J_{11}$ applies, $C_{C,11}$ being the coefficient of chromatic aberration of the object lens 11. The current variation $\Delta J_{11}$ of the object lens 11 thus is to be effected according to the equation $$\Delta J_{11} = - \frac{C_{C,15}}{C_{C,11}} \cdot \frac{J_{11}}{J_{15}} \Delta J_{15}.$$

The negative sign means that an increase in the current in the coil of the object lens 15 corresponds to a decrease in the current in the coil of the object lens 11 and vice versa. A benefit of this method according to the invention is that it is completely immaterial whether for instance the displacement of the part of the surface disposed near the lens axis, of the uniformly thick workpiece disc, has resulted by a slight wavy distortion of the disc or whether a per se planar disc incidently or by mechanical inaccuracies of its attachment to the traversal stage 35 is not precisely normal to the device axis or whether the table 35 is displaced slightly in axial direction during its transverse shifting. It must further be stressed that the focus correction provided for according to the invention in relationship to time represents a true-time correction, and at the same time is also true in reference to the locus in that sense that the correction signal according to the invention will always be derived underneath the workpiece part just to be provided with the pattern. This area may readily also be disposed somewhat off axis, the additional defocussing caused by the image field curvature being able to be calculated from theory and included into the automatic correction program of the data processing system.

Even a non-uniform thickness of the workpiece disc may, when it is known from a preceding measurement in dependency of the locus on the disc, be included in an obvious manner in the method for a focus correction. The knowledge of the additional defocussing of the object lens 11 just required therefor may be derived from the position of the traversal stage.

In FIGS. 1 to 3, electromagnetic lenses have been plotted as examples for the corpuscular-optical lenses. Such lenses will mainly be preferred when as corpuscular beams both in the first and in the second radiation source electron beams are used. It may also be advantageous, however, to use electrostatic lenses for the corpuscular-optical lenses of the arrangement according to the invention, for instance the individual lenses, e.g., Einzel lenses, known since long ago.

Such an Einzel lens is illustrated diagrammatically in FIG. 4 and is designated by the reference numeral 39. It comprises a central electrode 41 applied to high voltage, said electrode being carried by an insulator 46 and secured insulated thereby against its housing 45. Two external electrodes 40 and 42 are at earth potential just as the external housing and the rest of the device. The electric voltage of the central electrode 41 which is supplied via a rod 44 is generally of the same magnitude for a lens of short focal length as the voltage of the cathode from which the electrons are emitted or possibly corresponds to the acceleration voltage of ions when ion beams are used.

For the corpuscular radiation device according to the invention, electrostatic lenses will mainly be used to advantage when ion beams are used as corpuscular beams, because electrostatic lenses designed for electron beams maintain the same power of refraction also for ion beams when both corpuscle types have been accelerated with a voltage of the same magnitude. In contradistinction thereto, electromagnetic lenses constructed for electrons have a power of refraction smaller by some orders for ion beams so that magnetic lenses of a short focal length are able to be realized, less simply for ion beams.

It may be of an advantage, however, also when using electron beams for the arrangement according to the invention to insert an electrostatic lens into the beam path. It must be considered that the plane of the reference object 13 just like the surface of the workpiece 14 according to the invention are to correspond to the plane which contains the major surface 12 of the workpiece 14 or are to extend in close proximity therewith. On the other hand, the workpiece wafer is of a finite thickness. When a change-over is to be effected in the scanning-microscopic beam path from scanning of the reference object 13 to the scanning of the bottom surface of the workpiece, the power of refraction of the object lens 15 would have to be increased. This, however, would have as an unwanted disturbance that the magnetic stray field of this lens might change just enough that it could impair the mutual adjustment of the beams produced by the first and second radiation source just achieved as an object of the invention.

It is therefore of an advantage for the arrangement according to the invention to provide for the power of refraction required additionally for the object lens stage by an electrostatic lens, for electrostatic lenses have no external stray field and thus are also not able to impair the beam path external to the lens. As illustrated in FIG. 4, the electrostatic lens 39—as viewed in beam direction of the beam emitted from the second source—may be arranged in close proximity in front of the object lens 15. The electrostatic lens and the object lens then coact as a single thick lens which is focussed to the bottom surface of the workpiece 14.

Figure 5:
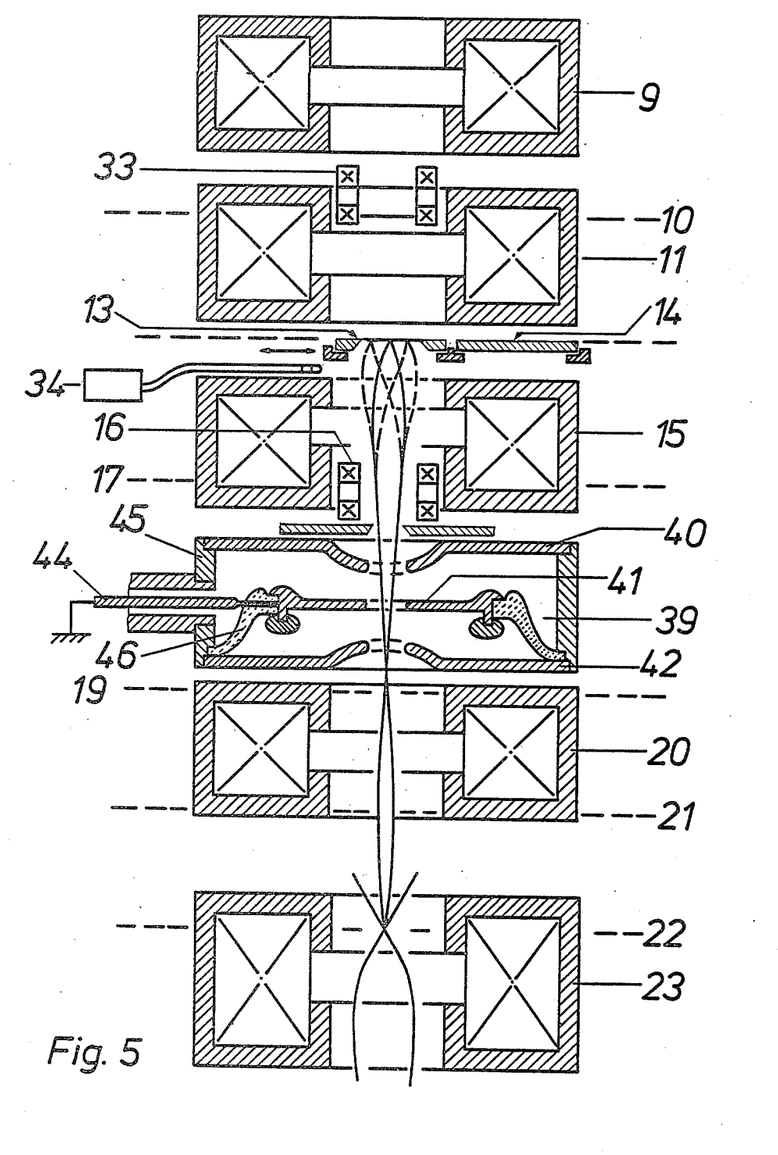

When the reference object 13 is to be scanned with the scanning microscope, the electrostatic lens is switched off in that the voltage supply rod 44 is put to earth potential. This situation has been illustrated in FIG. 5. In FIGS. 4 and 5, the beam path underneath the lens 23 and above the lens 9 exactly corresponds to the one present in FIG. 2 and therefore did not have to be illustrated again.

The invention may be embodied in other specific forms without departing from the spirit or essential characteristics thereof. The embodiments are therefore to be considered in all respects as illustrative and not restrictive.

What is claimed is:

1. A corpuscular radiation device for producing an irradiation pattern on a workpiece comprising:
   (a) means for adjustably supporting a workpiece having opposed major surfaces, and at least one partially irradiatable object and a free beam passage opening;
   (b) a first radiation source spaced from one of said surfaces of said workpiece for emitting a first beam;
   (c) a first corpuscular-optical condenser lens system for directing said first beam in one direction along a path towards said one surface of said workpiece;
   (d) a second radiation source spaced from the other of said surfaces of said workpiece for emitting a second beam;
   (e) a second corpuscular-optical lens system for directing said second beam in the direction opposite said first direction along said path towards said other surface of said workpiece;
   (f) an image receiver with a receiver surface;
   (g) said second radiation source and said image receiver being arranged adjacent said path on the side of said second corpuscular optical lens system remote from said workpiece supporting means; and
   (h) a beam switch arranged in said path and between said second radiation source and said image receiver on the one hand and said second corpuscular-optical lens system on the other hand for interlacing said first and second beams along said path;
   (i) said second corpuscular-optical lens system being adapted to function as an electron microscope system for directing said first beam towards said receiving surface of said image receiver and to function as an electron scan microscope for directing said second beam towards said first radiation source; and
   (j) said beam switch being adapted to deflect the beam produced by the first radiation source so that the corpuscular microscopic image drafted by the second corpuscular optical lens system is incident upon the receiver surface of the image receiver; and
   (k) said beam switch also being adapted to deflect the beam produced by the second radiation source to the axis of the second corpuscular lens system.

2. A corpuscular radiation device as set forth in claim 1, wherein said second corpuscular-optical lens system comprises a plurality of corpuscular lenses arranged in series along said path, the corpuscular lens (15) closest to the workpiece (14) having associated therewith a deflection system (16).

3. A corpuscular radiation device as set forth in claim 1, wherein said first corpuscular-optical lens system comprises a plurality of corpuscular lenses arranged in series along said path, the corpuscular beam lens (11) closest to the workpiece (14) having associated therewith a deflection system (33).

4. A corpuscular radiation device as set forth in claim 2, wherein the deflection system (16) is arranged in relationship to the associated corpuscular lens (15) in a focal plane (17) remote from the workpiece.

5. A corpuscular radiation device as set forth in claim 3, wherein the deflection system (33) is arranged in relationship to the associated corpuscular beam lens (11) in a focal plane (10) remote from the workpiece (14).

6. A corpuscular radiation device as set forth in claim 2, wherein the deflection system (16) associated with the second corpuscular-optical lens systems (15,20,23) is adapted to be operated selectively either with a deflection variable saw-tooth-like in time as required for a raster scan microscope or with a deflection settable in magnitude but constant in time.

7. A corpuscular radiation device as set forth in claim 3, wherein the deflection system (33) associated with the first corpuscular-optical lens system (5,7,9,11) is adapted to be operated selectively either with a deflection variable in such a manner that it corresponds to the scribing of the irradiation pattern to be produced or with a basic deflection settable but then constant in time superimposed by a scan-like deflection on the beam.

8. A corpuscular radiation device as set forth in claim 1, wherein said first and second corpuscular-optical lens systems each comprises a plurality of corpuscular lenses arranged in series along said path, the lenses (11) and (15) of both lens systems closest to the workpiece (14) being constructed mirror-symmetrical relative to a plane containing the major surface (12) of the workpiece (14) which faces the first radiation source (1).

9. A corpuscular radiation device as set forth in claim 1, wherein said first and second corpuscular-optical lens systems each comprises a plurality of corpuscular lenses arranged in series along said path, the corpuscular lens (15) of the second corpuscular-optical lens system closest to the workpiece (14) having associated therewith a deflection system (16) and the corpuscular beam lens (11) of the first corpuscular-optical lens system closest to the workpiece (14) having associated therewith a deflection system (33), said deflection systems (16) and (33) associated with the two corpuscular beam systems being constructed mirror-symmetrical relative to a plane containing the major surface (12) of a workpiece (14) which faces said first radiation source (1).

10. A corpuscular radiation device as set forth in claim 1, wherein said first and second corpuscular-optical lens systems each comprises a plurality of corpuscular lenses arranged in series along said path, at least one of said corpuscular lenses being a magnetic lens.

11. A corpuscular radiation device as set forth in claim 1, wherein said first and second corpuscular-optical lens systems each comprises a plurality of corpuscular lenses arranged in series along said path, at least one of said corpuscular lenses being an electrostatic lens.

12. A corpuscular radiation device as set forth in claim 9, wherein at least one of the deflection systems (16) and (33) is magnetic.

13. A corpuscular radiation device as set forth in claim 9, wherein at least one of the deflection systems (16) and (33) is an electric deflection system.

14. A corpuscular radiation device as set forth in claim 1, wherein said first and second corpuscular-optical lens systems each comprises a plurality of corpuscular lenses arranged in series along said path, the corpuscular lenses (11) and (15) of both corpuscular-optical systems closest to the workpiece (14) being electromagnetic lenses and the currents in the lens coils being adapted to be jointly varied by small amounts such that if the current in the coil of either one of said electromagnetic lenses increases the current in the coil of the other of said electromagnetic lenses decreases simultaneously, the ratio of the absolute values of the current changes being a fixed value.

15. A corpuscular radiation device as set forth in claim 1, wherein said second corpuscular-optical lens system comprises a plurality of copuscular lenses arranged in series along said path and an electrostatic lens (39) selectively capable of being switched in and out, as viewed in in the sense of the beam direction of said second radiation source, is provided in front of the lens (15) of the second corpuscular-optical system closest to the workpiece (14) and together therewith forms a single thick lens.

16. A corpuscular radiation device as set forth in claim 1, wherein the beam switch (24) is a magnetic beam switch.

17. A corpuscular radiation device as set forth in claim 1, wherein the corpuscular beams are electron beams.

18. A corpuscular radiation device as set forth in claim 1, wherein at least one of the corpuscular beams is an ion beam.

* * * * *